United States Patent
Clement et al.

(10) Patent No.: US 6,809,254 B2
(45) Date of Patent: Oct. 26, 2004

(54) ELECTRONICS ENCLOSURE HAVING AN INTERIOR EMI SHIELDING AND COSMETIC COATING

(75) Inventors: Thomas A. Clement, Lexington, MA (US); Ming Zhou, Boxborough, MA (US)

(73) Assignee: Parker-Hannifin Corporation, Cleveland, OH (US)

( * ) Notice: Subject to any disclaimer, the term of this patent is extended or adjusted under 35 U.S.C. 154(b) by 0 days.

(21) Appl. No.: 10/175,163

(22) Filed: Jun. 18, 2002

(65) Prior Publication Data

US 2003/0015334 A1 Jan. 23, 2003

Related U.S. Application Data

(60) Provisional application No. 60/289,919, filed on Jul. 20, 2001.

(51) Int. Cl.[7] .................................................. H05K 9/00
(52) U.S. Cl. ........................... 174/35 MS; 174/35 R; 361/816
(58) Field of Search ........................ 174/35 R, 35 MS; 361/816, 818

(56) References Cited

U.S. PATENT DOCUMENTS

| | | |
|---|---|---|
| 2,778,868 A | 1/1957 | Stinger |
| 4,227,037 A | 10/1980 | Layton |
| 4,435,565 A | 3/1984 | Stirling et al. |
| 4,545,926 A | 10/1985 | Fouts, Jr. et al. |
| 4,652,695 A | 3/1987 | Busby |
| 4,777,565 A | 10/1988 | McIntosh |
| 4,780,575 A | 10/1988 | Flavin et al. |
| 4,795,975 A * | 1/1989 | Cox .......................... 324/156 |
| 4,857,668 A | 8/1989 | Buonanno |
| 4,874,903 A | 10/1989 | Clarke |
| 4,952,448 A | 8/1990 | Bullock et al. |
| 5,008,485 A | 4/1991 | Kitagawa |
| 5,020,866 A | 6/1991 | McIllwraith |
| 5,028,739 A | 7/1991 | Keyser et al. |
| 5,039,825 A | 8/1991 | Samarov |
| 5,045,635 A | 9/1991 | Kaplo et al. |

(List continued on next page.)

FOREIGN PATENT DOCUMENTS

| | | |
|---|---|---|
| DE | 197 28 839 C1 | 9/1998 |
| EP | 0 654 962 A1 | 11/1994 |
| EP | 0 813 805 B1 | 9/1998 |
| JP | 4023497 | 1/1992 |
| JP | 5-7177 | 1/1993 |
| JP | 293989 | 11/1997 |
| JP | 11032824 | 2/1999 |
| JP | 11121964 | 4/1999 |

OTHER PUBLICATIONS

International Application Published Under the PCT, International Publication No. WO96/22672.
International Application Published Under the PCT, International Publication No. WO97/26782.
International Application Published Under the PCT, International Publication No. WO98/47340.

(List continued on next page.)

*Primary Examiner*—Hung V. Ngo
(74) *Attorney, Agent, or Firm*—John A. Molnar, Jr.

(57) ABSTRACT

An enclosure for housing circuitry of an electronic device including at least one enclosure part, and a shielding layer on the part. The enclosure part has an exterior surface and an opposing interior surface defining a wall therebetween, and is formed of a plastic material which is generally transparent. The shielding layer is provided to cover at least a portion of the interior surface of the enclosure part. The layer is formulated to provide EMI shielding for the circuitry housed within the enclosure, and as coated or otherwise applied to the interior surface is visually perceptible through the exterior surface of the enclosure part for enhancing the cosmetic appearance of the enclosure.

17 Claims, 1 Drawing Sheet

U.S. PATENT DOCUMENTS

| | | |
|---|---|---|
| 5,105,056 A | 4/1992 | Hoge, Jr. et al. |
| 5,142,101 A | 8/1992 | Matsuzaki et al. |
| 5,147,121 A | 9/1992 | McIllwraith |
| 5,150,282 A | 9/1992 | Tomura et al. |
| 5,160,807 A | 11/1992 | Fry et al. |
| 5,166,864 A | 11/1992 | Chitwood et al. |
| 5,185,654 A | 2/1993 | Mosher et al. |
| 5,202,536 A | 4/1993 | Buonanno |
| RE34,393 E | 9/1993 | McIlwraith |
| 5,260,513 A | 11/1993 | Giles et al. |
| 5,326,414 A | 7/1994 | Mosher et al. |
| 5,489,489 A | 2/1996 | Swirbel et al. |
| 5,566,055 A | 10/1996 | Salvi, Jr. |
| 5,578,790 A | 11/1996 | Peregrim |
| 5,641,438 A | 6/1997 | Bunyan et al. |
| 5,678,699 A | 10/1997 | Gebka |
| 5,731,541 A | 3/1998 | Bernd et al. |
| 5,847,317 A | 12/1998 | Phelps |
| 5,882,729 A | 3/1999 | Kahl et al. |
| 5,910,524 A | 6/1999 | Kalinoski |
| 6,096,158 A | 8/2000 | Kahl et al. |
| 6,096,413 A | 8/2000 | Kalinoski et al. |
| 6,121,545 A | 9/2000 | Peng et al. |
| 6,188,174 B1 | 2/2001 | Marutsuka |

OTHER PUBLICATIONS

Chomerics Preliminary Product Data sheet for Cho–Shield® 256.
Chomerics Cho–Shield Conductive Cloatings.
Chomerics Technical Bulletin 22.
Chomerics Technical Bulletin for Cho–Ver Shield.
Chomerics Technical Bulleting 48.
Chomerics Cho–Ver Shield Covers.
Chomerics Cho–Form® Automated Form–in–Place EMI Gasketing Technology.
Chomerics Conductive Elastomer EMI Shielding/Grounding Spacer Gaskets.
Chomerics Cho–Form Robotically Dispensed Form–in–Place EMI Gasketing.
Chomerics Preliminary Product Data Sheet Cho–Shield® 2054.
International Application Published Under the PCT, International Publication No. WO98/54942.
International Application Published Under the PCT, International Publication No. WO99/40769.
International Application Published Under the PCT, International Publication No. WO99/43191.
Chomerics, Parker–Hannifin Corp., brochure entitled "EMI Shielding and Grounding Spacer Gaskets" dated 1996.
Processing of Single and Multi–component Adhesives and Sealants by Paul Ivanfi, together with translation (undated).
Chomerics Parker–Hannifin Corp. Technical Bulletin 22 entitled "Cho–Shield EMI Shielding Covers"dated 1996.
Parker Seals article entitled "Parshield Conductive Elastomers" dated 1993.
Article by Shu H. Peng and W. S. Vicent Teng of Chomerics Parker–Hannifin Corporation entitled "Recent Development in Elastomeric EMI Shielding Gasket Design" (undated).
Copy of Patent application Ser. No. 60/183,395 filed Feb. 18, 2000 and assigned to Parker–Hannifin Corporation, entitled "Manufacture of Low Closure Force, Form–in–Place EMI Shielding Gasket".

* cited by examiner

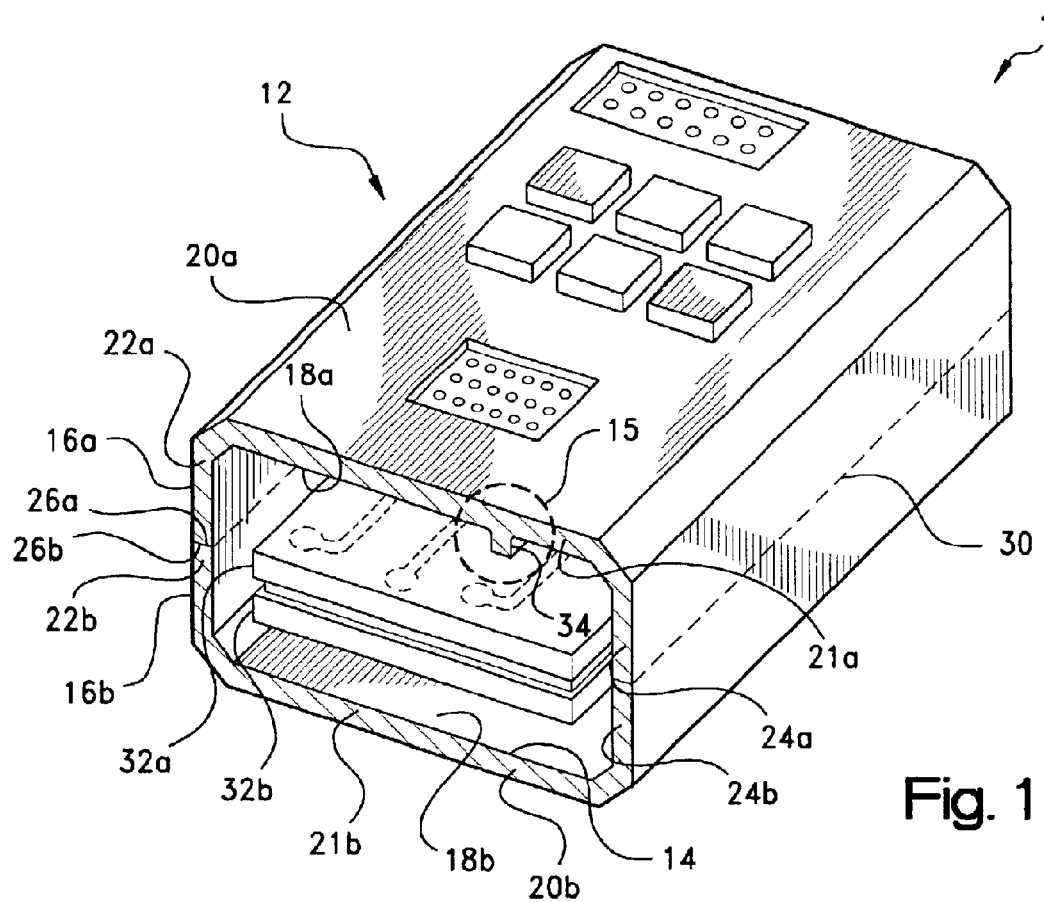
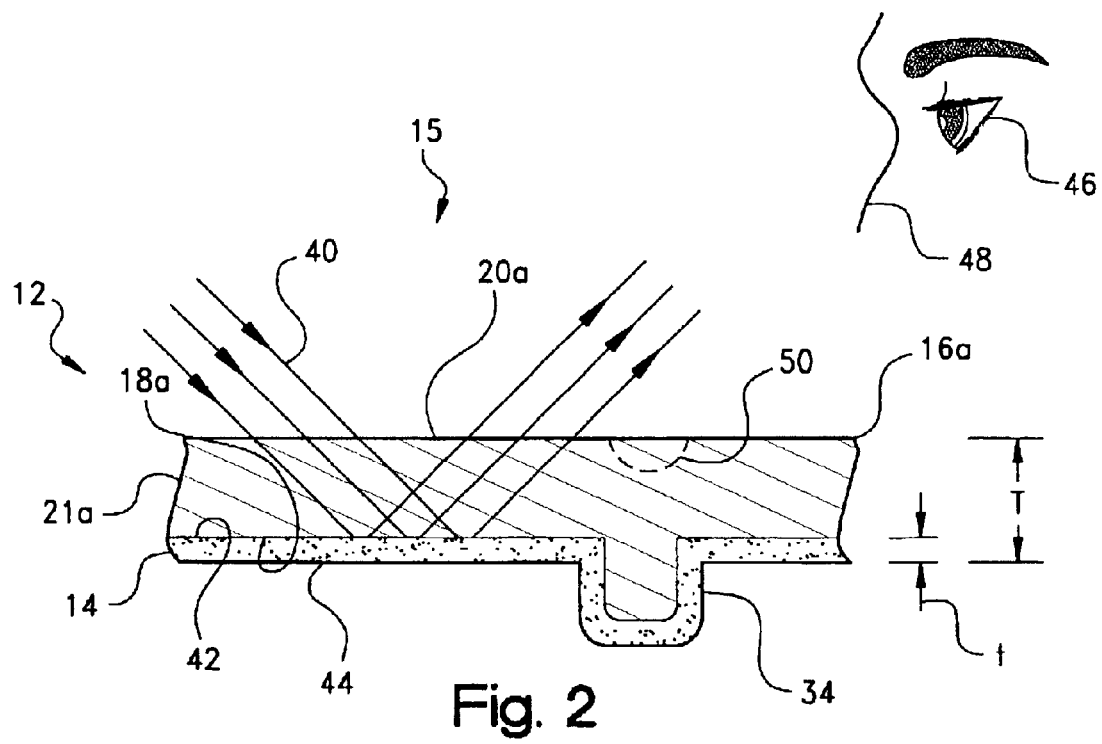

ELECTRONICS ENCLOSURE HAVING AN INTERIOR EMI SHIELDING AND COSMETIC COATING

CROSS-REFERENCE TO RELATED CASE

The present application claims priority to U.S. Provisional Application Ser. No. 60/289,919; filed Jul. 20, 2001.

BACKGROUND OF THE INVENTION

The present invention relates broadly to electromagnetic interference (EMI) shielding enclosures, such as cases, housings, or parts thereof such as covers, for mobile, i.e., cellular telephone handsets and other electronic devices, and particularly to a coating for such enclosures which is applied in a colored layer to an interior surface of an enclosure part formed of a clear or otherwise optically transparent or translucent plastic, such layer being electrically-conductive or otherwise providing EMI shielding and also being visually perceptible through the exterior surface of the part to provide a cosmetic enhancement to the enclosure or enclosure part.

The operation of electronic devices such as televisions, radios, computers, medical instruments, business machines, communications equipment, and the like is attended by the generation of electromagnetic radiation within the electronic circuitry of the equipment. As is detailed in U.S. Pat. Nos. 5,202,536; 5,142,101; 5,105,056; 5,028,739; 4,952,448; and 4,857,668, such radiation often develops as a field or as transients within the radio frequency band of the electromagnetic spectrum, i.e., between about 10 KHz and 10 GHz, and is termed "electromagnetic interference" or "EMI" as being known to interfere with the operation of other proximate electronic devices.

To attenuate EMI effects, shielding having the capability of absorbing and/or reflecting EMI energy may be employed both to confine the EMI energy within a source device, and to insulate that device or other "target" devices from other source devices. Such shielding is provided as a barrier which is interposed between the source and the other devices, and typically is configured as an electrically conductive and grounded housing which encloses the device. The housing may be formed of a metal such as steel, aluminum, or magnesium, or alternatively, of a plastic or other polymeric material which is provided with a conductive coating generally applied across the interior surfaces of the housing. The coating may be an electrically-conductive paint, a conductively-filled, molded elastomeric layer, a metal foil laminate or transfer, or a flame-sprayed or other deposited metal layer. A conductive gasket may be used to provide electrical continuity between the coating layers applied to the various mating housing parts.

An integrated EMI shielding solution for electronics enclosures, further described in commonly-assigned U.S. Pat. No. 5,566,055 and in DE 19728839, involves the over-molding of the housing or cover with an conductive elastomer. The elastomer is integrally molded in a relatively thin layer across the inside surface of the housing or cover, and in a relatively thicker layer along the interface locations thereof providing both a gasket-like response for environmentally sealing the cover to the housing and electrical continuity for the EMI shielding of the enclosure. The elastomer additionally may be molded onto interior partitions of the cover or housing, or itself molded to integrally-form such partitions, providing electromagnetically-isolated compartments between potentially interfering circuitry components. Covers of such type are marketed commercially under the name Cho-Shield® Cover by the Chomerics EMC Division of Parker-Hannifin Corporation (Woburn, Mass.).

Conventionally, most conductive coatings formulated for EMI shielding applications naturally exhibit a brown or gray appearance as a result of their being loaded with silver or particles or another metal filler. As many housings, and particularly those for mobile telephones, are formed of a black plastic, a black pigment or dye may be added to the coating to match the coating color to the substrate color. Coatings of such type are marketed by the Chomerics EMC Division of Parker Hannifin Corporation, Woburn, Mass., under the tradename Cho-Shield™ 2052, and by Spraylat Corporation, Mount Vernon, N.Y. Should another color for the handset be desired, a nonconductive paint may be applied to the external surfaces of the housing. Alternatively, a colored faceplate may be used.

As electronic devices such as mobile phone handsets continue to proliferate, it is believed that additional EMI shielding alternatives and options for handset cases and other enclosures would be well-received by the electronics industry.

BROAD STATEMENT OF THE INVENTION

The present invention is directed to an electromagnetic interference (EMI) shielded enclosure, such as a case, housing, or a part thereof such as a cover, for mobile telephone handsets and other electronic devices. More particularly, the invention relates to an electrically-conductive coating or other shielding layer for such enclosures which is applied in an opaque or other colored layer to an interior surface of an enclosure part formed of a clear or otherwise optically transparent or translucent plastic, such layer providing EMI shielding and also being visually perceptible through the exterior surface of the part to provide the enclosure or enclosure part with a colorful or otherwise enhanced cosmetic appearance.

In an illustrative embodiment, the shielding layer is provided as an electrically-conductive, water-borne or solvent-based paint or other coating which may comprise a polyurethane, acrylic, or other resin binder and an electrically-conductive filler such as silver, silver-plated copper, or other metal particles or mixtures thereof. Although the coating may be left to exhibit a natural brown or silver color, a pigment, dye, or other colorant preferably is added to mask the natural color and to imbue another color such as black, white, yellow, green, red, blue, orange, purple, or, indeed, any color in the spectrum. Other or additional fillers or additives may be used to render the coating fluorescent, phosphorescent, or reflective. The coating may be sprayed, dip-coated, brushed, rolled, or otherwise applied to one or more of the interior surfaces of the enclosure or a part thereof such as a cover, and then dried or otherwise cured to form an adherent film or other layer thereon. Prior to cure, the layer may be embossed or otherwise textured to further enhance its light transmitting or reflecting priorities.

In further accordance with the precepts of the present invention, the enclosure or enclosure part to which the shielding layer is applied is formed of a clear, transparent, or translucent plastic which may be an acrylic, acrylonitrile-butadiene-styrene (ABS), polyvinyl chloride (PVC), polyphenylene ether (PPE), polystyrene (PS), polycarbonate (PC), polyamide, nylon, polyolefin, or a copolymer or blend thereof. As a result, the coating layer remains visually perceptible through the exterior surface of the enclosure part Advantageously, the shielding layer so formed provides EMI shielding across the interior surface of the enclosure while, at the same time, eliminating the need for an external cosmetic coating. Moreover, by virtue of its application to the interior surface of the enclosure or enclosure part, the shielding layer, which may be formulated to exhibit a multitude of colors, is generally protected from the scratches or other damages to which an exterior paint is susceptible. Further, such shielding layer, in combining EMI shielding and cosmetic functions, is economical and simplifies manufacture in eliminating the necessity of having to provide a separate cosmetic paint layer. These and other advantages will be readily apparent to those skilled in the art based upon the disclosure contained herein.

BRIEF DESCRIPTION OF THE DRAWINGS

For a fuller understanding of the nature and objects of the invention, reference should be had to the following detailed description taken in connection with the accompanying drawings wherein:

FIG. 1 is a perspective end view, partially in cross-section, of a handheld electronic communication device representative of a typical application for the EMI shielding enclosure herein involved having an interior combination EMI shielding and cosmetic coating layer; and FIG. 2 is a magnified view of a portion of the enclosure of FIG. 1 showing the combination EMI shielding and cosmetic coating layer of the present invention in enhanced detail.

The drawings will be described further in connection with the following Detailed Description of the Invention.

DETAILED DESCRIPTION OF THE INVENTION

Certain terminology may be employed in the description to follow for convenience rather than for any limiting purpose. For example, the terms "forward," "rearward," "right," "left," "upper," and "lower" designate directions in the drawings to which reference is made, with the terms "inward," "inner," or "inboard" and "outward," "outer," or "outboard" referring, respectively, to directions toward and away from the center of the referenced element, and the terms "radial" or "horizontal" and "axial" or "vertical" referring, respectively, to directions, axes, planes perpendicular and parallel to the central longitudinal axis of the referenced element. Terminology of similar import other than the words specifically mentioned above likewise is to be considered as being used for purposes of convenience rather than in any limiting sense.

In the figures, elements having an alphanumeric designation may be referenced herein collectively or in the alternative, as will be apparent from context, by the numeric portion of the designation only. Further, the constituent parts of various elements in the figures may be designated with separate reference numerals which shall be understood to refer to that constituent part of the element and not the element as a whole. General references, along with references to spaces, surfaces, dimensions, and extents, may be designated with arrows.

For the purposes of the discourse to follow, the precepts of the present invention are described in connection with the application of the combination electromagnetic interference (EMI) shielding and cosmetic layer herein involved as sprayed or otherwise coated or applied to the interior surface of a housing, case, or other enclosure for a handheld electronic communication device such as a mobile, i.e., cellular, telephone. For the purposes hereof, the term "EMI shielding" should be understood to include, and to be used interchangeably with, surface grounding, corona shield, radio frequency interference (RFI) shielding, and anti-static protection. In view of the discourse to follow, however, it will be appreciated that aspects of the present invention may find utility in other applications, such as for other electronic devices, including indoor or outdoor cabinets, requiring both EMI shielding and cosmetic enhancement. Use within those such other applications therefore should be considered to be expressly within the scope of the present invention.

Referring then to the figures, an exemplary electronics device is shown generally at 10 in the perspective view of FIG. 1 as including a case, housing, or enclosure, reference generally at 12, which is modified in accordance with the precepts of the present invention as having a combination EMI shielding and cosmetic layer, 14. For purposes of illustration, device 10 is shown to be a mobile telephone handset, but alternatively may be another handheld, portable, or other electronics device such as a personal communications services (PCS) handset, PCMCIA card, global positioning system (GPS), radio receiver, personal digital assistant (PDA), notebook or desktop personal computer (PC), cordless telephone handset, network router or server, medical electronics device, or the like. Enclosure 12 is shown to be of a 2-part construction including a upper half or cover, 16a, and a lower half or base, 16b, each of the parts 16a–b having a corresponding interior surface, 18a–b, and an exterior surface, 20a–b, which extend contentiously to form adjoining top and bottom walls, 21a–b, side walls, 22a–b and 24a–b, and end walls (not shown). The side and end walls together define the perimeters of each of the enclosure parts 16a–b, which is demarked by a peripheral edge surface, 26a–b. The edge surfaces 26 are mating and define a joint, parting line, or other interface, 30. A compressible gasket or other seal (not shown), which may be electrically conductive, typically is provided in the interface 30 as interposed between the surfaces 26 to provide electrical continuity and/or environmental sealing between the parts 16. As is shown, enclosure 12 may house one or more printed circuit boards (PCBs), 32a–b, or other circuitry of the device 10.

For the purposes of the present invention, one or both of the enclosure parts 16a–b, which may be constructed of the same or different materials, may be injection or otherwise molded or formed of a clear or otherwise transparent thermoplastic or other plastic material such as a poly(ether ether ketone) (PEEK), polyimide (PI), a high molecular weight polyethylene (HMWPE), polypropylene (PP), or other polyolefin, polyetherimide (PEI), polybutylene terephthalate (PBT), polyethylene terephthalate (PET), a nylon or other polyamide, fluoropolymer, polysulfone, polyester, acetal homo or copolymer, liquid crystal polymer (LCP), polyacrylic, polymethylacrylates, poly(ester and ether urethane), polyurethane, acrylonitrile-butadiene-styrene (ABS), polyvinyl chloride (PVC), polyphenylene ether (PPE), polyphenylene oxide (PPO), polystyrene, or polycarbonate (PC), or a copolymer or blend of any of the foregoing. As used herein, "transparent" should be understood to be used in a general sense as exhibiting sufficient light transmittance, such as at least about 50% as may be measured, for example, in accordance with ASTM D 1003, for shielding layer 14 to be at least partially visible through the exterior surface 20a–b of the enclosure part 16, and in that regard is used interchangeably with "clear" and "translucent." Depending upon the preference of the designer or the requirements of the particular application, the parts 16a–b may be colorless, i.e., "water clear" or "water white,"

or colored or hued, such as by means of a dye or other colorant incorporated into the plastic material forming the enclosure part.

As the plastic material forming the enclosure parts 16 will generally be non-electrically conductive, shielding layer 14 is provided, as may be seen with additional reference to the area 15 magnified view of FIG. 2, as an adherent, electrically-conductive film or other coating or the like which is applied as an EMI shielding layer to cover at least a portion of one or both of the interior surfaces 18a–b of the corresponding enclosure part 16a–b. For most applications, shielding layer 14 will have a film thickness, referenced at "t" in FIG. 2, of between about 0.1–10 mils (0.0025–0.25 mm), with the enclosure parts 16a–b having a thickness, referenced at "T" in FIG. 2 of between about 0.01–1 inch (0.025–2.5 cm).

In an illustrative embodiment, shielding layer 14 is manually or robotically sprayed, such as by means of a standard high volume/low pressure (HVLP) gun or propeller-agitated pressure equipment, dipped, brushed, rolled, or otherwise applied as a conductive paint or other coating to the interior surfaces 18. Such coating may be waterborne or other inorganic solvent-based, methyl ethyl ketone (MEK) or other organic solvent-based, and further may be formulated as a one or two-component air, thermal, moisture, UV, radiation, or other cure system which may include a blend of one or more resins and one or more electrically-conductive fillers. By way of example, the one or more resins conventionally may be an acrylic, polyurethane, or epoxy polymer, or a copolymer or blend thereof, and in the cured film of shielding layer 14 may form a continuous phase or binder for the filler.

Suitable electrically-conductive fillers include: noble and non-noble metals such as nickel, copper, tin, aluminum, and nickel; noble metal-plated noble or non-noble metals such as silver-plated copper, nickel, aluminum, tin, or gold; non-noble metal-plated noble and non-noble metals such as nickel-plated copper or silver; and noble or non-noble metal plated non-metals such as silver or nickel-plated graphite, glass, ceramics, plastics, elastomers, or mica; and mixtures thereof. The filler is broadly classified as "particulate" in form, although the particular shape of such form is not considered critical to the present invention, and may include any shape that is conventionally involved in the manufacture or formulation of conductive materials of the type herein involved including hollow or solid microspheres, elastomeric balloons, flakes, platelets, fibers, rods, irregularly-shaped particles, or a mixture thereof. Similarly, the particle size of the filler is not considered critical, and may be or a narrow or broad distribution or range, but in general will be between about 0.250–250 $\mu$m, and more typically between about 1–100 $\mu$m.

The filler is loaded in the composition in a proportion sufficient to provide the level of electrical conductivity and EMI shielding effectiveness in the cured layer 14 which is desired for the intended application. For most applications, an EMI shielding effectiveness of at least 10 dB, and usually at least 20 dB, and preferably at least about 60 dB or higher, over a frequency range of from about 10 MHz to 10 GHz is considered acceptable. Such effectiveness translates to a filler proportion which generally is between about 10–80% by volume or 50–90% by weight, based on the total volume or weight, as the case may be, of the shielding formulation, and a surface resistance of about 0.10 $\Omega$/sq. or less, although it is known that comparable EMI shielding effectiveness may be achieved at lower conductivity levels through the use of an EMI absorptive or "lossy" filler such as a ferrite or nickel-coated graphite. As is also known, the ultimate shielding effectiveness of the cured layer 14 will vary based on the amount of the electrically-conductive or other filler material, and on the film thickness.

Additional fillers and additives may be included in the formulation depending upon the requirements of the particular application envisioned. Such fillers and additives may include conventional wetting agents or surfactants, opacifying agents, anti-foaming agents, anti-static agents, coupling agents such as titanates, chain extending oils, tackifiers, pigments, lubricants, stabilizers, emulsifiers, antioxidants, thickeners, and/or flame retardants such as aluminum trihydrate, antimony trioxide, metal oxides and salts, intercalated graphite particles, phosphate esters, decabromodiphenyl oxide, borates, phosphates, halogenated compounds, glass, silica, silicates, and mica. Particularly, and depending upon the requirements of the application involved, one or more pigments, dyes, or other colorants may be added to the formulation to mask the natural color thereof attributable to the electrically-conductive filler. As mentioned, such colorants may include organic or inorganic pigments such as titanium dioxide, chromium oxide, iron oxide, lead chromates and molybdates, metallic complexes, phthalocyanine blue, and carbon black, dyes such as azo or other conjugate compounds, special colorants such as coated micas and other pearlescent pigments, metal flake pigments, fluorescent ("day-glo") pigments which absorb and re-emit UV or visible light, phosphorescent or other luminescent pigments which are excited by UV or visible light and continue to emit after the extinction of the radiation source, reflectants such as solid or hollow glass microspheres, and blends of one or more of the foregoing. Typically, these such other fillers and additives are blended or otherwise admixed with the formulation, and may comprise between about 0.05–80% or more by total volume thereof. In the case of the addition of a dye, such dye typically may comprise between about 1% by total weight of the formulation.

The formulation for shielding layer 14 may be compounded in a conventional mixing apparatus as a one or two-part admixture of the resin or resin system parts, filler, and pigment, dye, and/or other optional additive components. Depending upon the resin system, water or another inorganic or organic solvent or other diluent may be added to control the viscosity of the fluent admixture which may be adjusted for spray application. The formulation, as mentioned, may be applied as a one or two-part system using conventional spray equipment to at least a portion of, or substantially the entirety of, one or both of the interior surfaces 18a–b of the enclosure parts 16a–b and cured to form an adherent film layer thereon. By "cured," it is meant that the film is polymerized, crosslinked, further crosslinked or polymerized, vulcanized, hardened, dried, or otherwise chemically or physically changed from a liquid or other fluent form into a solid phase. Such film forms the adherent shielding layer 14 which may bond to the interior surface 18 via chemical, mechanical, electrostatic, van der Waals, or other forces. As a result of its being loaded with an electrically-conductive filler, the shielding layer 14 which is formed on the surface 18 typically will be opaque. However, such layer also may be translucent or other otherwise as transmitting some light but causing sufficient diffusion to prevent perception of distinct images therethrough.

Advantageously, the shielding layer 14 formed by spraying is a conformal coating in that it is able to cover ribs, stiffeners, and other surface asperities or discontinuities, such as is referenced at 34 in FIGS. 1 and 2, which may be formed in the surfaces 18. The shielding layer also may be applied, however, by other direct or indirect means such as knife coating, roller coating, brushing, casting, drum coating, dipping, dispensing, extrusion, screen printing, transfer, and the like.

For enhanced visual effects, the inner surfaces 18 and/or the shielding layer 14 may be embossed, patterned, or otherwise texture to increase light reflection and/or refraction. Also, two or more colors of shielding layer 14 may be applied in different patterns, such as stripes, swirls, or as over and under layers. Shielding layer 14 also may be used in conjunction with transfer decals, appliques, and the like which may be, for example, interposed between the surfaces 18 and the shielding layer 14.

Although the formation of shielding layer 14 has been described herein primarily in conjunction with a paint-spray application, it will be appreciated that other, different types of shielding layers 14 may be employed without departing from the cope of the invention herein involved. For example, layer 14 may be formed as is described in commonly-assigned U.S. Pat. No. 5,566,055 as an electrically-conductively-filled silicone or other elastomer which is over-molded onto the surfaces 18. Alternatively, layer 14 may be or clad, laminated, or metallized, such as by chemical, i.e., electroless, or electrolytic plating, vacuum or chemical vapor deposition, evaporation, sputterring, or plasma coating, onto the surfaces 18 as a thin, i.e., 0.004–10 mil (0.0001–0.254 mm) metal film or foil. Particularly, the layer 14 may be formed as a conformal coating by the electric arc/wire arc thermal spraying of tin, nickel, or an alloy thereof in the manner further described in commonly-assigned U.S. application Ser. No. 10/137,229, filed May 1, 2002, entitled "Manufacture of Electronics Enclosure Having a Conformal Corrosion-Resistant Metallized Shielding Layer Threaded Pipe Connection with Improved Seal," the disclosure of which is expressly incorporated herein by reference.

Referring now particularly to the magnified view of FIG. 2, it may be seen that, with the enclosure 12 and the parts 16a–b thereof being structured as described, at least a portion of the incident light waves, referenced at 40, impinging upon the exterior surfaces 20 is transmitted through the walls of the enclosure parts 16. Depending upon the color of layer 14, light of a certain frequency or range is reflected back (or absorbed in the case of a black layer 14) by the outer surface, 42, of layer 14, which also has an opposing inner surface, 44, to the eye, referenced at 46, of an observer, 48. Thus, the observer 48 is able to visually perceive the layer 14 through the walls of the enclosure parts 16, such layer 14 thereby providing an aesthetic enhancement for the device 10 while, at the same time, providing EMI shielding for the enclosure 12.

Moreover, as compared to external coatings, the internal shielding layer 14 will be appreciated to be protected by the enclosure walls from surface nicks, scratches, or like. Advantageously, should the exterior surface 20 of the enclosure parts 16 become nicked, scratched, or otherwise damaged, such as is shown in phantom at 50 in FIG. 2, such damage 50, which normally will not penetrate through to layer 14, is generally masked by the shielding layer 14 and thereby is less perceptible to the observer 48.

As it is anticipated that certain changes may be made in the present invention without departing from the precepts herein involved, it is intended that all matter contained in the foregoing description shall be interpreted as illustrative and not in a limiting sense. All references including any priority documents cited herein are expressly incorporated by reference.

What is claimed is:

1. An enclosure for housing circuitry of an electronic device, said enclosure comprising:

at least one enclosure part having an exterior surface and an opposing interior surface defining a wall of said enclosure part therebetween, said enclosure part being formed of a plastic material which is generally transparent; and a shielding disposed on and covering at least a portion of the interior surface of said enclosure part, said shielding layer being bonded to the interior surface of said enclosure part and providing EMI shielding for the circuitry housed within said enclosure and being visually perceptible through the exterior surface of said enclosure part enhancing the cosmetic appearance of said enclosure.

2. The enclosure of claim 1 wherein said plastic material is generally clear.

3. The enclosure of claim 1 wherein said plastic material is selected from the group consisting of poly(ether ether ketones), polyimides, polyolefins, polyetherimides, polybutylene terephthalates, polyethylene terephthalates, nylons, polyamides, fluoropolymers, polysulfones, polyesters, acetal homo and copolymers, liquid crystal polymers, polyacrylics, polymethylacrylates, poly(ester and ether urethanes), polyurethanes, acrylonitrile-butadiene-styrene, polyvinyl chlorides, polyphenylene ethers, polyphenylene oxides, polystyrenes, polycarbonates, and copolymers and blends thereof.

4. The enclosure of claim 1 wherein said shielding layer exhibits an EMI shielding effectiveness of at least about 60 dB substantially over a frequency range of between about 10 MHz and about 10 GHz.

5. The enclosure of claim 1 wherein said shielding layer is electrically-conductive.

6. The enclosure of claim 5 wherein said shielding layer has an electrical surface resistance of not greater than about 0.10 Ω/sq.

7. The enclosure of claim 1 wherein said shielding layer has a thickness of between about 0.1–10 mils (0.0025–0.25 mm).

8. The enclosure of claim 1 wherein said wall has a thickness of between about 0.01–1 inch (0.025–2.5 cm).

9. The enclosure of claim 1 wherein said shielding layer is generally opaque.

10. The enclosure of claim 1 wherein said shielding layer forms a conformal coating on the interior surface of said enclosure part.

11. The enclosure of claim 1 wherein said shielding layer comprises a metal coating.

12. The enclosure of claim 11 wherein said metal coating comprises tin, nickel, or an alloy thereof.

13. An enclosure for housing circuitry of an electronic device, said enclosure comprising:

at least one enclosure part having an exterior surface and an opposing interior surface defining a wall of said enclosure part therebetween, said enclosure part being formed of a plastic material which is generally transparent; and a shielding layer covering at least a portion of the interior surface of said enclosure part, said shielding layer providing EMI shielding for the circuitry housed within said enclosure and being visually perceptible through the exterior surface of said enclosure part enhancing the cosmetic appearance of said enclosure, the shielding layer comprises the cured film of an admixture of one or more resin components, and one or more electrically-conductive particulate fillers.

14. The enclosure of claim 13 wherein said one or more resin components are selected, independently, from the group consisting of acrylics, polyurethanes, epoxies, and copolymers and blends thereof.

15. The enclosure of claim 13 wherein said admixture comprises between about 50–90% by weight of said one or more electrically-conductive particulate fillers.

16. The enclosure of claim 13 wherein said admixture further comprises one or more colorants.

17. The enclosure of claim 16 wherein said one or more colorants comprises one or more pigments or dyes, or a blend thereof.

* * * * *